United States Patent [19]

Lee et al.

[11] Patent Number: 5,011,762

[45] Date of Patent: Apr. 30, 1991

[54] PHOTOSENSITIVE COMPOSITIONS HAVING ENHANCED PHOTOPOLYMERIZATION RATE

[75] Inventors: Rong-Jer Lee, Yun-Lin; Chein-Dhau Lee, Hsinchu; Wen-Shin Shen, Hwa-Lien, all of Taiwan

[73] Assignee: Industrial Technology Research Institute, Hsinchu, China

[21] Appl. No.: 567,136

[22] Filed: Aug. 14, 1990

[51] Int. Cl.$^5$ .............................. G03C 1/725
[52] U.S. Cl. .................................. 430/281; 430/286; 430/287; 430/288; 430/916; 430/918; 430/923; 522/21; 522/30
[58] Field of Search ............... 430/281, 286, 287, 288, 430/916, 918, 923; 522/21, 30

[56] References Cited

U.S. PATENT DOCUMENTS

| | | |
|---|---|---|
| 3,640,718 | 2/1972 | Smith .................................. 430/281 |
| 3,891,441 | 6/1975 | Tsuji et al. ........................ 430/281 |
| 4,248,958 | 2/1981 | Faust ................................. 430/281 |
| 4,478,977 | 10/1984 | Sperry .............................. 430/281 |
| 4,645,465 | 8/1986 | Morgan et al. .................... 430/281 |
| 4,857,654 | 8/1989 | Riedker et al. .................... 430/281 |
| 4,859,572 | 8/1989 | Farid et al. ........................ 430/281 |

Primary Examiner—Jack P. Brammer
Attorney, Agent, or Firm—Scully, Scott, Murphy & Presser

[57] ABSTRACT

A photosensitive composition which is suitable for free radical polymerization systems initiated by ultraviolet light, particularly useful in UV-curing coating and image transfer systems such as printing plates and photoresists. Among the above mentioned applications, systems in which the photosensitive layer has no protective film to insulate it from the air shows the greatest improvement in photosensitivity.

6 Claims, No Drawings

PHOTOSENSITIVE COMPOSITIONS HAVING ENHANCED PHOTOPOLYMERIZATION RATE

BACKGROUND OF THE INVENTION

The UV coatings, UV print inks and systems which produce graphic transference under exposure after being developed, such as resin plate, photogravure printing plate and dry film photoresist, liquid photoresist and photo-image type liquid solder resist serving as a permanent protecting film, are generally cured by free radical photo-polymerization; the photoinitiator is irradiated with ultraviolet rays to yield free radicals which then initiate the chain addition-polymerization of unsaturated polyfunctional photoreactive materials to produce a network structure.

Such free radical polymerization systems are of great importance in industrial practices and the formulations have been continuously improved. However, due to the inhibition of free radical curing by atmospheric oxygen, the photosensitivity and resolution are often unsatisfactory.

Taking UV ink (coating) as an example, after the screen printing, the coated substrate (usually a plate) is passed through a conveyor into a UV drier. During the process of UV irradiation, oxygen in the air attacks the surface of the ink and thus greatly reduces the degree of crosslinking. Hence, the film may be etched by acids, bases or organic solvents such as methyl ethyl ketone, trichloroethane when subject to the subsequent cleaning procedure. Another example is liquid photoresist or liquid solder resist, to which volatile solvent (boiling point less than 250° C.) is usually added to facilitate the coating operation such as dip coating, roller coating, curtain coating or screen printing. In the selective exposure process, the solvent should be removed by preheating so that the photoresist or solder resist is dried and free from tackiness, and then the film having graphs (artwork) together with a photoresist or solder resist will be exposed. Because the substrate or the surface of the photoresist layer is not smooth enough, some air remains between the film and photoresist, and oxygen inhibition results in insufficient crosslinking. In this system, however, materials containing carboxylic groups such as water base photoresist or solder resist are washed with developer at the subsequent stage, and thus not only the unexposed portion is washed away, but also, to a certain extent, the exposed portion which was inhibited by oxygen. As to solder resist, both non-homogeneity of appearance and tin contamination during soldering result from inhibition of oxygen. As to dried film-resist, due to light scattering caused by the protective membrane between the film and photoresist layer which prevent oxygen inhibition, the resolution is reduced.

The reduction of oxygen inhibition is discussed and disclosed extensively in the literature, for instance, "Photopolymerization of surface coating" by C. G. Roffey, chapter 3, p.127 to 130, (John-Wiley & Son Ltd. 1982) discloses several methods of achieving a reduction of oxygen inhibition including application of a barrier layer, using more powerful-intensity lamps and combining benzophenone/tertiary-amine, etc.

Other patent literature also makes disclosures:

U.S. Pat. No. 3,753,720 discloses that the polythiol-polyene system can achieve sufficient photo-curing effect, however, the system has a severe odor problem.

U.S. Pat. No. 3,759,807 discloses that using a coinitiator such as benzophenone/triethanolamine may increase the curing speed, however, the odor problem still exists. When the co-initiator is applied to the acid contained resin systems, precipitation may occur.

EP 0,037,604 and EP 0,037,152 disclose that by using initiator systems containing alkylsulfonate and sulfonic groups may accelerate the surface curing speed. However, use of the ionic compounds may effect the electrical properties and the sulfonic group containing initiator is difficult to synthesize. The possibility of commercial use is very low.

Another literature concerning oxygen exhibition is disclosed in "Materials for Microlithography", by A. Hult and B. Ranby, p.457, ACS symposium series 266, which makes use of the following initiator:

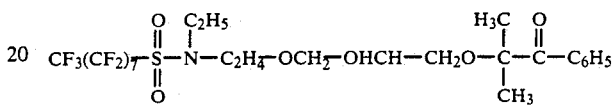

to accelerate surface curing speed. However, from an economic point of view, it is unlikely to be put into practical use.

Therefore, reduction of oxygen inhibition practical for use in industrial production is an urgent need. In the present invention, surprisingly we find by applying the high boiling point compounds in the photoreactive composition which comprise the following formula:

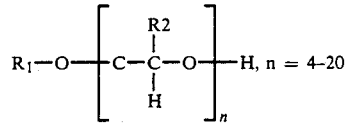

wherein
$R_1$ is hydrogen liner alkyl or acyl groups having 1-20 carbon atoms;
$R_2$ is hydrogen or methyl group;
in a photopolymerization composition. The photosensitivity is obviously increased and adding the photosensitive promoter into the composition will not destroy or reduce the originally designed performance.

Generally, the present composition is a photocurable mixture which comprises at least (a) a material having unsaturated carbon-carbon double bonds which undergoes free radical polymerization;

(b) a photoinitiator which produces free radicals when irradiated with ultraviolet light; and (c) a photosensitivity accelerator of the formula

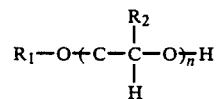

wherein
$R_1$ is hydrogen, linear alkyl or acyl groups having 1 to 20 carbon atoms; n=4-20;
$R_2$ is hydrogen or methyl group; and the complete formula
has a boiling point greater than 300° C. The composition, when mixed with other conventional additives, obtains liquid photoresist, UV-ink or coating or photo-image type liquid solder resist with higher photosensitivity.

DETAILED DESCRIPTION OF THE INVENTION

The present composition comprises at least:
(a) a material having unsaturated carbon-carbon double bonds which undergoes free radical polymerization;
(b) a photoinitiator which produces free radicals when irradiated with ultraviolet light; and
(c) a photosensitivity accelerator.

The material having unsaturated carbon-carbon double bonds which undergoes free radical polymerization includes compounds having at least two acrylate, methacrylate, vinyl or allyl groups. Those suitable for the present composition are photosensitive monomers which are liquid or fluid at room temperature including bi-functional monomers such as polyethylene glycol diacrylate, polyethylene glycol dimethacrylate, propylene glycol diacrylate, butanediol diacrylate, pentanediol diacrylate, 1,6-hexanediol diacrylate, 1,6-hexanediol dimethacrylate, tetraethylene glycol dimethacrylate, glycerol diacrylate, tripropylene glycol diacrylate and polyester diacrylate; trifunctional monomers such as trimethylol propane triacrylate, pentaerythritol triacrylate, trimethylol propane trimethacrylate, tris(acryloxyethyl)isocyanurate, ethoxylated trimethylol propane triacrylate and propoxylated glycerol triacrylate; polyfuctional monomers such as ditrimethyolpropane tetraacrylate pentaerythritol tetraacrylate and dipentaerythritol hydroxy pentaacrylate.

Those suitable for the present composition can also be high molecular weight unsaturated compounds such as polyacrylate, polyamide, polyester, polyether polyurethane and poly(vinyl alcohol) that contain photoreactive acrylate groups. The grafting of the unsaturated acrylate groups to the side chains of the polymer is generally carried out by the copolymerization of two or more monomers to give a polymer and to provide the reactive functional groups grafted on the main chain of the polymer. Unsaturated acrylate compounds that have functional groups can react with said reactive groups and then graft to the polymer. Reactive groups that are directly or indirectly joined at the polymer include hydroxyl, amino, carboxyl, amide, isocyanate or epoxy. Carboxyl and hydroxyl are the most commonly used reactive groups. If the reactive group is hydroxyl, the unsaturated acrylate compound generally contains carboxyl, chloro formyl, or isocyanate functional groups. If the reactive group attached of the polymer is carboxyl, the unsaturated acrylate compound generally contains hydroxyl, epoxy or isocyanate. If the reactive group attached to the polymer is amino, the unsaturated acrylate compound generally contains isocyanate, chloro formyl or epoxy. If the reactive group attached to the polymer is isocyanate, the unsaturated acrylate compound generally contains hydroxy or carboxyl functional groups. If the reactive group attached to the polymer is epoxy, the unsaturated acrylate compound generally contains the carboxyl functional group. Accordingly, the unsaturated acrylate compound generally contains functional groups such as carboxyl, chloro formyl or isocyanate. The previous method not only makes the polymer contain unsaturated acrylate but also provides other functional groups such as carboxyl and hydroxyl to fit utilizations such as alkali developable photoresist or solder resist; or provides epoxy, carboxyl and hydroxy crosslinking with thermal curing agent; for instance, polyamine, polyamide, or anhydride crosslinking with epoxy or carboxyl. For instance, melamine may crosslinking with epoxy, hydroxy or carboxyl to enhance the thermal resistant property of coatings like solder resist. Other suitable high molecular weight unsaturated compounds can be produced by the partial or complete esterification of the acrylate or methacrylate that contains amino or carboxyl with anhydride copolymers such as styrene-maleic anhydride copolymer.

The preferred average molecular weight of the above mentioned polymers ranges from 10,000 to 1,000,000. The acid value of the polymer should be greater than 70mg KOH/g, if the polymer is applied to alkali solution developing photoresist. Essentially, these polymers should provide the film-forming property to the composition of the photoresist and solder resist. The amount and molecular weight may be lower if the polymer is applied to the UV-ink or coatings.

Initiators suitable for the present composition include benzoin, benzoinalkyl ether, benzophenone, Michael's ketone, 4,4'-diethylin-benzophenone, acetophenone, benzil ketal and anthrone. These initiators may be used alone or in combination of two or more. The amount of initiator used is preferably 0.5-10% by weight based on the total weight of polymer and monomer of the composition.

Other components suitable for the present composition which are conventional and have been widely used in the coating industry such as silica, barium sulphate, calcium carbonate, talc, magnesium silicate and aluminum silicate, and are added in amounts of 1-30% by weight. Ultraviolet light absorbing pigments such as titanium oxide, antimonous oxide, magnesium oxide, zinc sulphate, zirconium oxide and sulfur white are added in amounts of 0-25% by weight. Pigment or dye stuff can also be added to the composition in an amount of about 0.05-2% by weight. A non-reactive diluent is used in an amount of 5-60% by total composition weight to adjust the viscosity, modification of viscosity depends on the coating method. 10-25% is needed for screen printing, and 20-50% is demanded for dipping coating or curtain coating to reduce viscosity.

The bubbles which form in coating process such as screen printing may be treated with defoaming agents such as Modaflow (R) of Monsanto, Byk 141 (R) of Bayer in amounts of 0.01-2% by weight, or thixotropic agents such as Aerosil (R) or Carbosil (R) in amounts of 1-10% by weight. To extend the storage period, inhibitors (or free radical scavengers) such as hydroquinone, or 2,5 dimethyl benzoquinone should be added in a proper amount, preferably 0.001-0.1%.

In the case of the photoresist type solder resist, the thermoreactive component should be incorporated into the present composition to increase the thermal resistance. For instance, the thermal curing systems such as that containing epoxy resin and tertiary amine or anhydride, or that containing hexamethoxymethyl melamine and a hydroxyl containing carboxyl or amino groups are used to increase the degree of polymerization. The amount depends on the degree of curing density. Said epoxy, hydroxyl, carboxyl and amino groups may also be included in the above mentioned compositions.

Photosensitivity promoter

Very often, tertiary amine is used in combination with hydrogen abstraction type initiator to accelerate polymerization. However, tertiary amine possesses unfavorable odor and has miscibility problems, especially, in the application of the alkali solution soluble photoresist and solder resist system, and the efficiency is limited. The polythiol system has essentially no oxygen inhibition problem, but the odor and low polymerization rate are deficiencies. Waxing causes problems when the coating film is re-coated. Sulphonate ions may affect the electrical properties of the coating film. Photocure in a nitrogen atmosphere is unfit for practical use. When studying formulations of photoreactive compositions, we surprisingly find that compounds of the formula

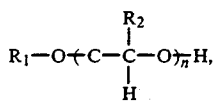

wherein n=4-20, $R_1$ is hydrogen, linear alkyl or acyl groups having 1-20 carbon atoms, $R_2$ is hydrogen or methyl, greatly increase the photosensitivity of the photoreactive composition. The photosensitive promoter suitable for the present invention should have a boiling point greater than 300° C. and which be employed in an amount of 0.1-5% by weight.

The composition in accordance with the present invention is prepared with conventional processes such as mixing or blending to produce a homogeneous mixture. The composition is then coated onto the substrate with conventional coating techniques such as screen printing, roller coating, curtain coating, or dip coating to form a flat and uniform film. The substrate may be timber, metal or plastic. The source of light to carry out the exposure is a high or ultra-high pressure mercury lamp with wavelength from 200 to 600 nm. In case the present composition is applied for photoresist or solder resist, the following procedures should be applied:

(1) coat the photosensitive composition onto a copper foil or a circuit board;

(2) remove the solvent by pre-baking so that the coating is not tacky;

(3) put the film containing the circuit pattern onto the coating and choose the proper exposure energy to expose. The exposure machine may be the conventional 3 Kw-7 Kw ultra-high pressure mercury lamp; and (4) use converized developing machine for developing. The choice of the developer depends on the photoreactive composition used. In the case of a water based composition, 1% aqueous sodium carbonate solution is commonly used for developing. In the case of the solvent based composition, organic solvent such as 1,1,1-trichloroethane is used for developing.

In the above mentioned process, it is found that the composition of the present invention has a higher photoresistivity. The procedure for the test of photosensitivity is to put a Hitachi 21 panels stouffer step tablet onto dry photosensitive coating film to make the exposure, and the calculate the remaining panels after developing. In the 21 panels stouffer step tablet, the sensitivity of each step differs in $\sqrt{2}$ times. The higher the number of remaining steps, the higher the sensitivity of the composition, i.e. the effect of oxygen is inhibited to a greater degree. The following examples illustrate more details of the present invention wherein the quantity of each component is expressed by weight basis.

EXAMPLES

Example 1

To a 30 liter stainless steel reactor equipped a with stirrer, thermometer, dowtherm, cooling pipe, feeding pump and nitrogeneous deoxygenation device, 349 g of methacrylic acid, 750 g of methyl methacrylate, 288 g of butyl methacrylate, 45 g of n-dodecyl mercaptan, 31.5 g of 2',2'-azo bis(isobutyl acrylonitrile), 876 g of ethoxyethyl ethanol, 708 g of naphtha 150 and 948 g of ethylene glycol diacetate were added. The reaction temperature was controlled at 70° C., and then a solution of 1,394 g methacrylic acid, 1500 g methyl methacrylate, 75 g n-dodecyl mercaptan, 31.5 g 2',2'-azo bis(isobutyl acrylonitrile), 876 g ethoxyethyl ethanol, 708 g naphtha 150 and 948 g ethylene glycol diacetate was fed by the feeding pump into the reactor at a constant rate over in 6 hours. After feeding, the mixture was continuously stirred for 2 hours, and then the temperature was raised to 90° C. and stirred for another 3 hours. Then, the temperature of the mixture was reduced to room temperature and allowed to settle over night (about 8 hours). Then 13.5 g of hydroquinone, 63 g of tetra-n-butyl phosphate, 2,236 g of glycidyl methacrylate were added into the reactor, the mixture were heated to 90° C. and reacted for 6 hours by which the photosensitive polymer having carboxyl and unsaturated olefin groups was obtained. The reaction of the glycidyl methacrylate, as analyzed by gas phase chromatograph, read 93%. The polymer had an acid value of about 90 mg KOH/g, weight average molecular of 12,000 and solid content of 57%.

Example 2

The following components (solution A) were well mixed:

| | |
|---|---|
| The binder solution of example 1 (solid content of 0.57) | 175 g |
| Benzophenone | 4 g |
| 4,4'-bis(dimethylamino)benzophenone | 0.5 g |
| Dimethyl-2-phenyl-ethanoyl benzene | 8 g |
| hydroquinone | 0.2 g |
| Pentaerythritol triacrylate | 20 g |
| Green pigment #7 | 3 g |
| Modaflow ® | 4 g |
| Antimonous oxide | 3 g |
| Aerosil 200 ® | 5 g |
| Poly (ethylene oxide) lauryl ether (n = 9) | 3 g |

Another solution having the same composition as that of solution A, except that poly (ethylene oxide) lauryl ether (n=9) was not been added, was prepared (solution B).

The well mixed photosensitive compositions were coated onto copper foil and dried in a 80° C. baking. The coatings, after drying, had a thickness of about 1 mil, and were then covered with a Hitachi 21 panels stouffer step tablet, and exposed in an ORC-HMN exposure machine (3 KW), allowed to settle for 10 minutes after exposure, developed in a developer containing 1% sodium carbonate solution for 120 seconds and the numbers of the remaining panels were calculated (i.e. the photosensitivities of the corresponding formulations). The following is the table of the number of remaining panels of solutions A and B determined with various exposures (the number of remaining steps was determined on the basis that at least half of the area of each of the original steps remained).

The number of remaining steps after development:

| Exposure (mJ/cm2) | Solution A | Solution B |
| --- | --- | --- |
| 200 | 4 | 6 |
| 400 | 6 | 9 |
| 600 | 7 | 10 |
| 800 | 6 | 9 |

The above results show the surprising efficacy in the enhancement of photosensitivity made by the addition of poly (ethylene oxide) lauryl ether.

Example 3

Except for the controlled component, the formulation of the following four solutions is the same.

| | |
| --- | --- |
| The binder solution of example 1 (solid content of 0.57) | 175 g |
| Benzophenone | 4 g |
| 4,4'-bis(dimethylamino)benzophenone | 0.5 g |
| Dimethyl-2-phenyl-ethanoyl benzene | 8 g |
| hydroquinone | 0.2 g |
| Pentaerythritol triacrylate | 15 g |
| Trimethylol propane triacrylate | 10 g |
| Green pigment #7 | 3 g |
| Modaflow ® | 4 g |
| Antimonous oxide | 3 g |
| Aerosil 200 ® | 5 g |
| The controlled component | 4 g |
| A   poly (ethylene oxide) lauryl ether, n = 2 | |
| B   poly (ethylene oxide) lauryl ether, n = 20 | |
| C   poly (ethylene oxide) stearyl ether, n = 20 | |
| D   — | |

The above solutions were well mixed and the photosensitivity of each composition at various exposures was determined according to the procedures set forth in example 2. The results are shown in the following table.

| Exposure (mJ/cm2) | A | B | C | D |
| --- | --- | --- | --- | --- |
| 200 | 2 | 2 | 2 | 2 |
| 400 | 7 | 4 | 3 | 3 |
| 600 | 10 | 8 | 4 | 2 |
| 800 | 8 | 7 | 8 | 2 |

This example shows that poly (ethylene oxide) alkyl either greatly contributes in the increment of the photosensitivity of the photosensitive composition.

What is claimed is:

1. A photosensitive composition which utilizes ultraviolet light to initiate a free radical addition reaction, comprising at least:
   (a) a material having unsaturated carbon-carbon double bonds which undergoes free radical polymerization;
   (b) a photoinitiator which produces free radicals when irradiated with ultraviolet light; and
   (c) a photosensitivity accelerator of the formula

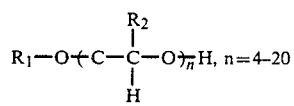

wherein $R_1$ is hydrogen, linear alkyl or acyl groups having 1 to 20 carbon atoms, $R_2$ is hydrogen or methyl, and added in a quantity of from 0.1 to 5% of the whole photosensitive material mixture.

2. The photosensitive composition as set forth in claim 1 wherein the material having unsaturated carbon-carbon double bond comprises at least two terminal or side functional radicals which is selected from the groups consisting of acrylate, methylacrylate ethyl or propyl radicals.

3. The photosensitive composition as set forth in claim 1, wherein the material having unsaturated carbon-carbon double bond further comprises a weak basic aqueous solution soluble polymer having weight average molecular weight from 10,000 to 1,000,000.

4. The photosensitive composition as set forth in claim 3, wherein the polymer comprises at least two unsaturated carbon-carbon double bonds at the side chain thereof.

5. The photosensitive composition as set forth in claim 1, wherein the material having unsaturated carbon-carbon double bond is polyfunctional photoreactive monomer or oligomer having average molecular weight of from 200 to 5,000.

6. The photosensitive composition as set forth in claim 1, wherein the photosensitivity accelerator has a boiling point greater than 300° C.

* * * * *

UNITED STATES PATENT AND TRADEMARK OFFICE
CERTIFICATE OF CORRECTION

PATENT NO. : 5,011,762

DATED : April 30, 1991

INVENTOR(S) : Rong-Jer Lee, et al.

It is certified that error appears in the above-identified patent and that said Letters Patent is hereby corrected as shown below:

Column 6, lines 17-18: "708 g naphtha 150 and 948 g ethylene glycol diacetate was fed" should read as --708 g of naphtha 150 and 948 g of ethylene glycol diacetate were added. The reaction temperature was controlled at 70°C, and then a solution of 1,394 g methacrylic acid, 1500 g methyl methacrylate, 75 g n-dodecyl mercaptan, 31.5 g 2',2'-azo bis(isobutyl acrylonitrile), 876 g ethoxyethyl ethanol, 708 g naphtha 150 and 948 g ethylene glycol diacetate was fed --

Signed and Sealed this

Twenty-seventh Day of October, 1992

*Attest:*

DOUGLAS B. COMER

*Attesting Officer*   Acting Commissioner of Patents and Trademarks